(12) United States Patent
Wälti

(10) Patent No.: US 10,257,948 B2
(45) Date of Patent: Apr. 9, 2019

(54) CLAMPING MODULE FOR SECURING TO A SUPPORT RAIL

(71) Applicant: SELECTRON SYSTEMS AG, Lyss (CH)

(72) Inventor: Christian Wälti, Kappelen (CH)

(73) Assignee: SELECTRON SYSTEMS AG (CH)

( * ) Notice: Subject to any disclaimer, the term of this patent is extended or adjusted under 35 U.S.C. 154(b) by 0 days.

(21) Appl. No.: 15/773,817

(22) PCT Filed: Nov. 4, 2016

(86) PCT No.: PCT/EP2016/076632
§ 371 (c)(1),
(2) Date: May 4, 2018

(87) PCT Pub. No.: WO2017/077017
PCT Pub. Date: May 11, 2017

(65) Prior Publication Data
US 2018/0324963 A1 Nov. 8, 2018

(30) Foreign Application Priority Data
Nov. 4, 2015 (EP) .................................... 15193045

(51) Int. Cl.
*H05K 7/14* (2006.01)
*H05K 5/02* (2006.01)
(Continued)

(52) U.S. Cl.
CPC ......... *H05K 5/0204* (2013.01); *H01R 9/2608* (2013.01); *H01R 25/142* (2013.01);
(Continued)

(58) Field of Classification Search
None
See application file for complete search history.

(56) References Cited

U.S. PATENT DOCUMENTS

| 5,704,805 A | 1/1998 | Douty et al. |
| 2015/0181745 A1 | 6/2015 | Hand et al. |

FOREIGN PATENT DOCUMENTS

| DE | 202011105337 U1 | 11/2011 |
| EP | 0740499 A1 | 10/1996 |

(Continued)

OTHER PUBLICATIONS

Search Report and Written Opinion for International Patent Application No. PCT/EP2016/076632; dated Feb. 16, 2017.

*Primary Examiner* — Xanthia C Cunningham
(74) *Attorney, Agent, or Firm* — Barnes & Thornburg LLP

(57) ABSTRACT

The invention relates to a clamping module for securing to a support rail, which has a housing, a bracing device and at least one retaining claw arranged thereon. The at least one retaining claw can be brought into a securing position on the support rail and clamped there by means of the bracing device, in order to detachably secure the clamping module to the support rail. According to the invention, the clamping module has a signal device, comprising at least one signal element arranged in the housing, which signal element can be moved along a predetermined movement path by placing the clamping module onto a support rail. Using the position of the signal element on the movement path, it can be identified from outside the housing whether the clamping module is correctly arranged on the support rail.

20 Claims, 4 Drawing Sheets

(51) Int. Cl.
*H02B 1/052* (2006.01)
*H01R 9/26* (2006.01)
*H01R 25/14* (2006.01)

(52) U.S. Cl.
CPC ......... *H02B 1/0526* (2013.01); *H05K 7/1474* (2013.01); *H05K 5/0221* (2013.01); *H05K 5/0226* (2013.01)

(56) References Cited

FOREIGN PATENT DOCUMENTS

| | | |
|---|---|---|
| EP | 0818062 A1 | 1/1998 |
| EP | 2887471 A1 | 6/2015 |

CLAMPING MODULE FOR SECURING TO A SUPPORT RAIL

PRIORITY CLAIM

This patent application is a U.S. National Phase of International Patent Application No. PCT/EP2016/076632, filed Nov. 4, 2016, which claims priority to European Patent Application No. 15193045.0, filed Nov. 4, 2015, the disclosure of which being incorporated herein by reference in their entireties.

FIELD

Disclosed embodiments relate to a clamping module for securing to a support rail, having a housing, a bracing device and at least one retaining claw, which is arranged on the bracing device, wherein the retaining claw can be moved into a securing position on the support rail, and can be braced there, by means of the bracing device, in order for the clamping module to be secured in a releasable manner to the support rail.

BACKGROUND

A clamping module for securing to a support rail is known, for example, from DE 20 011 105 337 U1. Support rails are used in electrical engineering in particular for securing components in distribution boxes, switch cabinets, terminal boxes and the like. Various electronic modules here are pushed laterally onto a support rail, or are plugged thereon from the front, and clamping modules arranged thereon in particular laterally secure the same against displacement as a result of shock and vibration. Support rails are standardized in accordance with DIN EN 60715.

SUMMARY

The disadvantage with the known clamping modules for securing onto a support rail is that they are positioned on the support rail from the front, as a result of which the rail located behind the clamping modules is concealed. It is, therefore, not possible for an installer to ascertain precisely whether the clamping module rests flush on the support rail, as is necessary for securing the clamping module. It is only once the device for securing the clamping module has been activated that it becomes apparent whether the clamping module is fixed to the support rail or, on account of the clamping module being positioned incorrectly on the support rail, locking of the clamping module on the support rail has not taken place. In such a case, the installer releases the securing device again in order to position the clamping module correctly on the support rail prior to the securing device being actuated anew. The installer's failure to ascertain the correct positioning of the clamping module on the support rail prior to the securing device being actuated gives rise to an increased level of outlay during the installation of known clamping modules.

Disclosed embodiments, therefore, are directed to providing an improved clamping module in the case of which it is easier to ascertain during installation whether the clamping module is arranged correctly on the support rail.

Disclosed embodiments provide a clamping module for securing to a support rail, having a housing, a bracing device and at least one retaining claw, which is arranged on the bracing device. The at least one retaining claw can be moved into a securing position on the support rail, and can be braced there, by means of the bracing device, in order for the clamping module to be secured in a releasable manner to the support rail.

According to disclosed embodiments, the clamping module has a signaling device with at least one signal element, which is arranged in the housing and can be moved along a predetermined movement path by virtue of the clamping module being positioned on a support rail. The position of the signal element on the movement path makes it possible to ascertain from outside the housing whether the clamping module is arranged correctly on the support rail.

BRIEF DESCRIPTION OF FIGURES

Further advantages, features and uses of the disclosed embodiments can be gathered from the following description in conjunction with the figures, in which.

DETAILED DESCRIPTION

Figure 1:
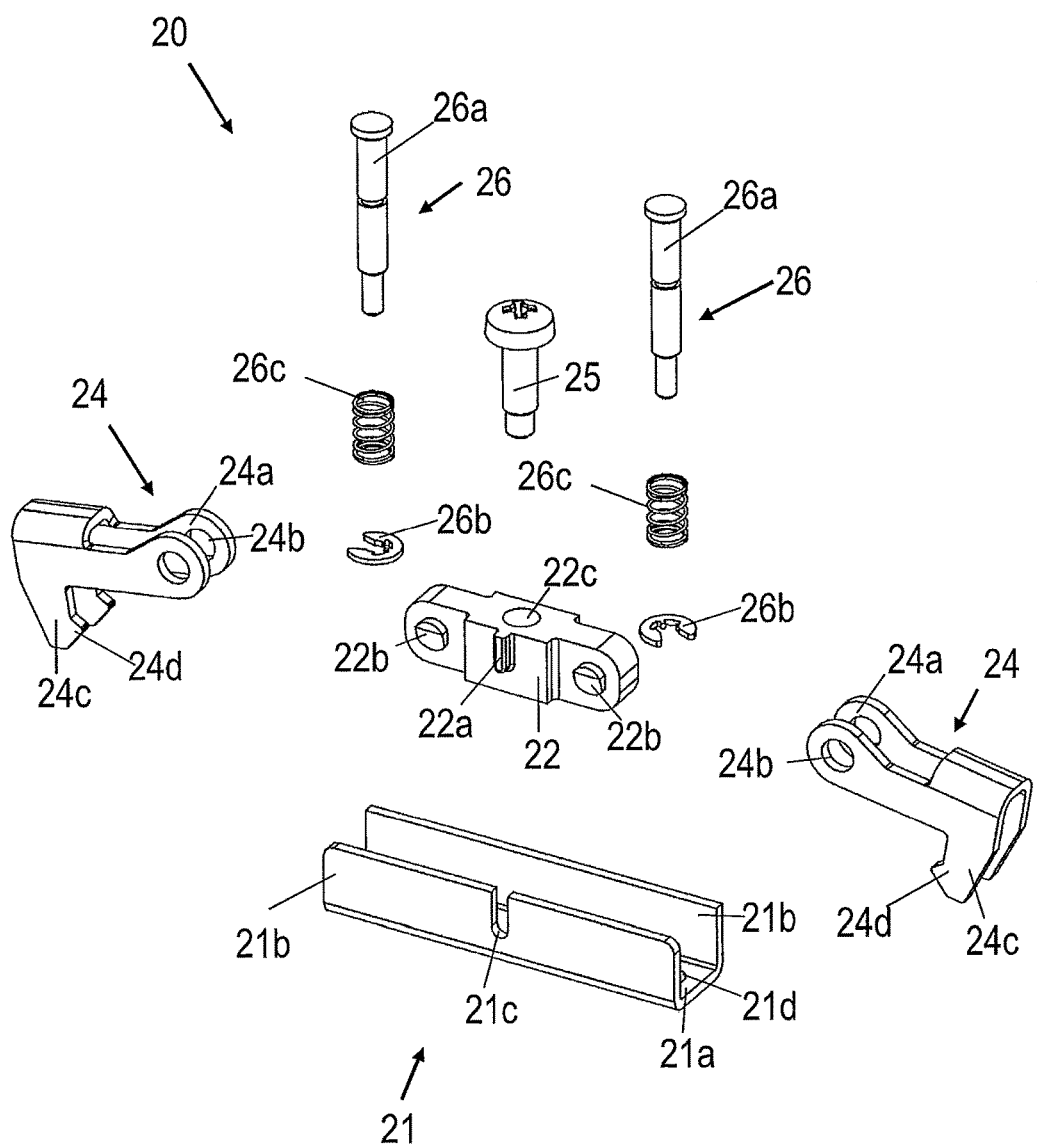
FIG. 1 shows the components of an exemplary bracing device of an exemplary clamping module according to disclosed embodiments.

The proposed solution makes it possible for the installer to ascertain, prior to a clamping module being secured to the support rail, whether the clamping module is arranged correctly on the support rail. Even prior to the securing device (bracing device) of the clamping module being actuated, it is thus possible to ascertain, with the aid of the signal device, whether the clamping module is arranged correctly on the support rail, in order for the position of the clamping module to be altered, if appropriate, before the clamping module is secured to the support rail. This makes it possible to avoid the situation where, on account of the clamping module being arranged initially incorrectly on the support rail, the installer secures the clamping module to an insufficient extent, and has to release the same again and then secure the clamping module anew to the support rail. Although it is also the case here that the rail located behind the clamping module is concealed, it is possible for the installer to ascertain the correct arrangement of the clamping module by way of the signal device, for which reason the proposed solution allows the clamping modules to be installed vertically on the support rail. It is thus possible to save time, and, therefore, costs, during the installation of clamping modules on support rails.

The clamping module has a housing and a bracing device, which is arranged optionally at least to some extent within the housing. The bracing device has arranged on it at least one retaining claw, which can be moved into a securing position on the support rail, and can be braced there, by the bracing device. Support rails which are frequently used, and are in the form for example of a top-hat profile, usually have two retaining flanges, by means of which modules are secured to the support rails. Depending on the embodiment of the support rail and clamping module, such a clamping module, therefore, usually has at least two retaining claws, by means of which the clamping module can be secured to a support rail. At least one retaining claw arranged on a bracing device here is one which secures the clamping module to the support rail, in particular braces it on the same. It is also possible for further retaining claws to be fixed on the clamping module and in the form of static retaining devices, for example forming abutments, to contribute to securing the clamping module to a support rail. In other embodiments, two or more retaining claws are connected to the bracing device and can be moved into a securing position on a support rail by means of the same.

In the case of the clamping module according to the disclosed embodiments, at least one retaining claw is moved into a securing position on the support rail by means of the bracing device, which can take place for example by means of at least one retaining claw being pivoted and/or displaced, in order for the clamping module to be secured in a releasable manner to the support rail. For embodiments on support rails having a plurality of securing points, it is, of course, possible within the context of the disclosed embodiments to arrange a plurality of retaining claws, for example 2, 3, 4, 5 or 6 or even more retaining claws, on the clamping module, wherein the retaining claws can also be arranged parallel or one beside the other in order to be secured at the same fastening position of the support rail. It is likewise possible for just one retaining claw to be of movable design, and, therefore, the retaining claw can be moved into a securing position on the support rail by means of the bracing device once a second, in particular fixed retaining claw is moved into a securing position, during the operation of placing the clamping module in position, and is secured to the support rail by virtue of at least one second retaining claw being braced.

The at least one signal element arranged in the housing can be moved along a predetermined movement path in particular by virtue of the clamping module being positioned on a support rail. The signal element can be moved on the movement path in particular such that the signal element is located at a predetermined position, which can be ascertained from outside the housing, when the clamping module is arranged correctly on the support rail. The signal device is understood to mean the signal element or the signal elements along with the interacting devices for indicating the correct position of the clamping module for installation purposes.

In the case of one embodiment of the clamping module, the signal device has two signal elements. This makes it possible to ascertain the correct arrangement of the clamping module from outside the housing at two different positions. Since clamping modules, for securing purposes, frequently butt against a support rail at at least two positions, two signal elements can be used to check the correct position at these two locations. However, it is likewise possible, for example in dependence on the construction of the support rail and of the clamping modules, to provide more than two signal elements, for example 3, 4, 5, 6 or even more signal elements.

In the case of one embodiment of the clamping module, the at least one signal element is a signal pin. In the case of one embodiment, the pin is designed, in conjunction with its movement path, such that one end of the signal pin butts against the surface of the support rail and the second end of the signal pin projects essentially into the region of the housing surface when the clamping module is arranged correctly. For example, the region of the housing surface is designed such that the pin end is arranged flush, for example, with the housing surface, or an element arranged thereon, in order for the correct arrangement of the clamping module on the support rail to be ascertained reliably and quickly on account of the position of the end of the signal pin. Such a configuration provides for reliable functioning and for the correct arrangement of the clamping module on the support rail to be ascertained in a reliable manner.

In the case of a further development of the clamping module, the bracing device has a pulling element, on which at least one retaining claw is arranged in a pivotable manner. The bracing device here is designed such that the at least one retaining claw can be pivoted into a securing position on the support rail. Since the at least one retaining claw can be pivoted into a securing position, in particular the operation of positioning the clamping module on the retaining rail is simplified. In particular in the case of configurations in which all the retaining claws can be pivoted into a securing position, there is no need for the clamping module to be pivoted onto the support rail.

In the case of a further development of the clamping module, the bracing device has a pressure-exerting plate, which butts against the support rail when the clamping module is arranged correctly on the support rail. The pressure-exerting plate here is designed in a manner corresponding to that surface of the support rail on which the clamping module appears to be fastened. The pressure-exerting plate here constitutes the bearing means for the clamping module on the support rail.

In the case of a further embodiment of the clamping module, in order to secure the latter to the support rail, the pulling element can be prestressed against the pressure-exerting plate. In the case of an embodiment in which the pressure-exerting plate constitutes the bearing and thus a connecting element between the clamping module and the support rail, the pressure-exerting plate is suitable for absorbing the tensioning forces from the bracing device.

In the case of one embodiment of the clamping module, the pulling element is braced against the pressure-exerting plate by means of a tensioning element, in particular a tightening screw. A tensioning element such as a tightening screw can provide for a cost-effective and, furthermore, easily adjustable option for bracing the pulling element. A tightening screw makes it possible to achieve, for example, a predetermined bracing length by way of a defined movement, for example a full revolution. This triggers a predetermined axial displacement of the pulling element and thus bracing of the retaining claws. It is likewise possible here, for example, to provide for easily adjustable bracing by means of a manually operable knurled screw or for more intensive bracing by means of a tool, for example a screwdriver.

One embodiment of the clamping module is suitable for securing to a support rail in the form of a top-hat rail. A top-hat rail is a standard support rail which is frequently used for the installation of electronic modules and has two retaining flanges which are directed outward parallel to the fastening surface and on which the retaining claws can engage.

In the case of a further embodiment, electronic components are arranged in the housing of the clamping module. The clamping module according to the disclosed embodiments can, therefore, be used both as a clamping module which has no electrical components, and, therefore, is used merely for the in particular lateral securing of electronic modules arranged on a support rail, and as a clamping module which has for example electronic components in its housing itself.

The disclosed embodiments also relate to a module system which has a plurality of electronic modules arranged one beside the other on a support rail, wherein a clamping module having one or more of the features described above is arranged on at least one side of the electronic modules arranged one beside the other. The module system also makes it possible, in particular, to tap the standard support rail when modules are resting thereon.

Figure 2:
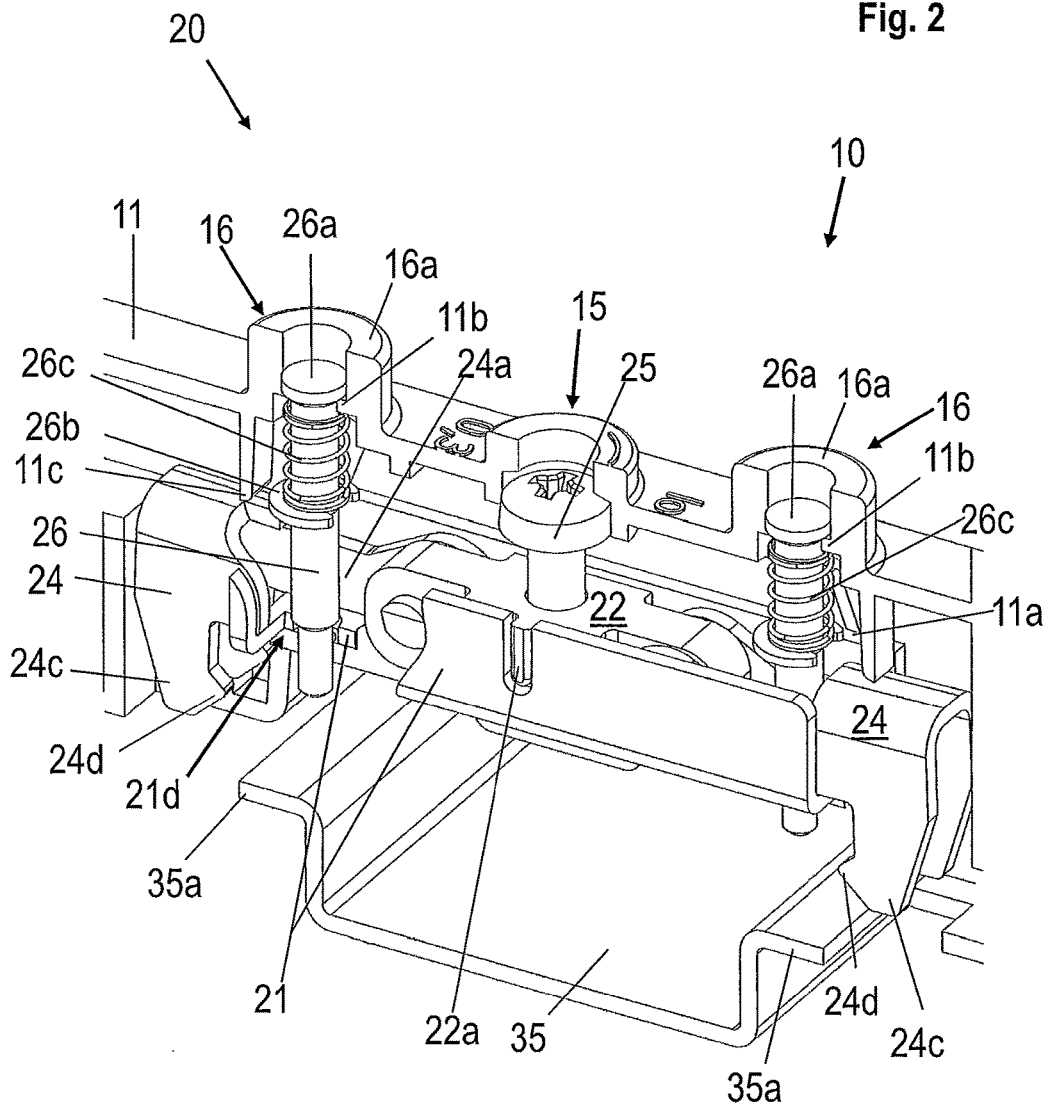
FIG. 2 shows a partly cut-away view of an exemplary clamping module according to the disclosed embodiments, having a bracing device made up of the components illustrated in FIG. 1, prior to being positioned on a support rail.
Figure 3:
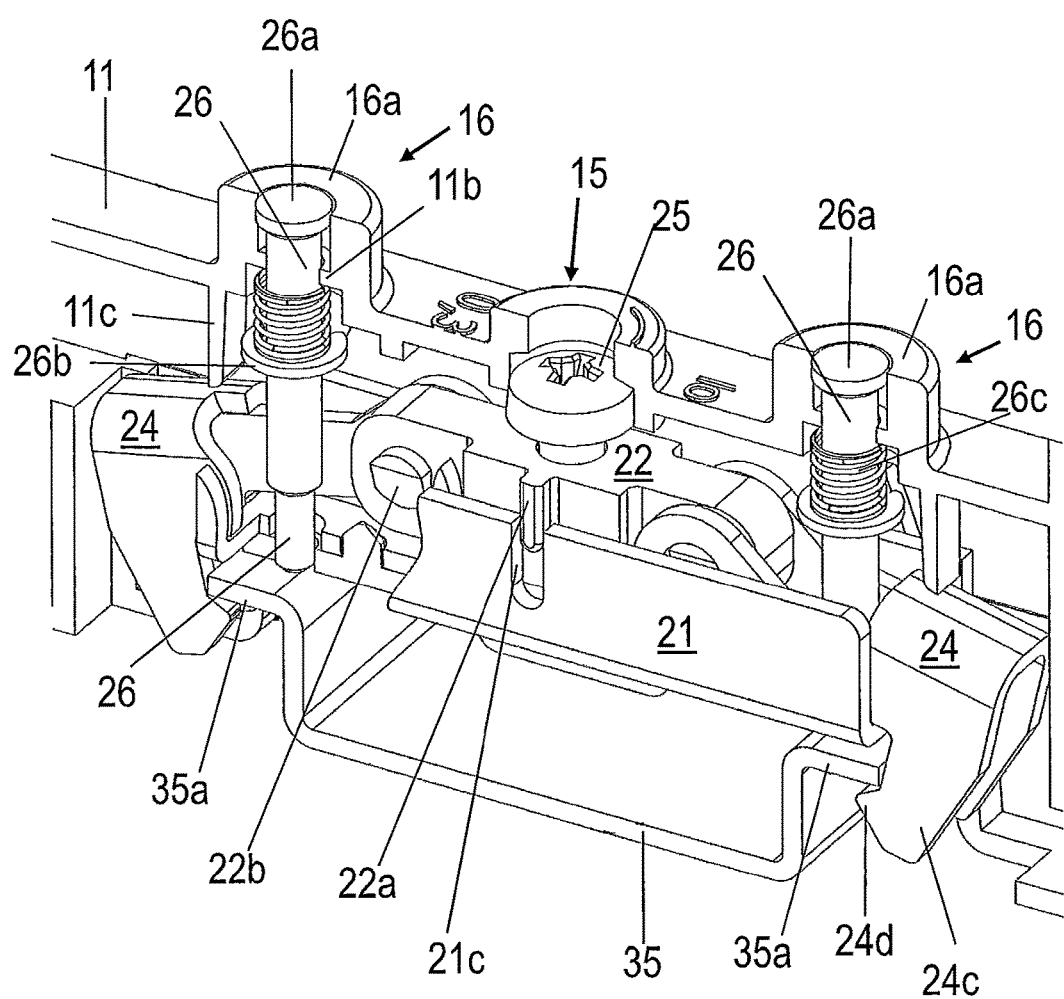
FIG. 3 shows a partly cut-away view of the exemplary clamping module according to the disclosed embodiments from FIG. 2, but this time in a state in which it is secured to the support rail.
Figure 4:
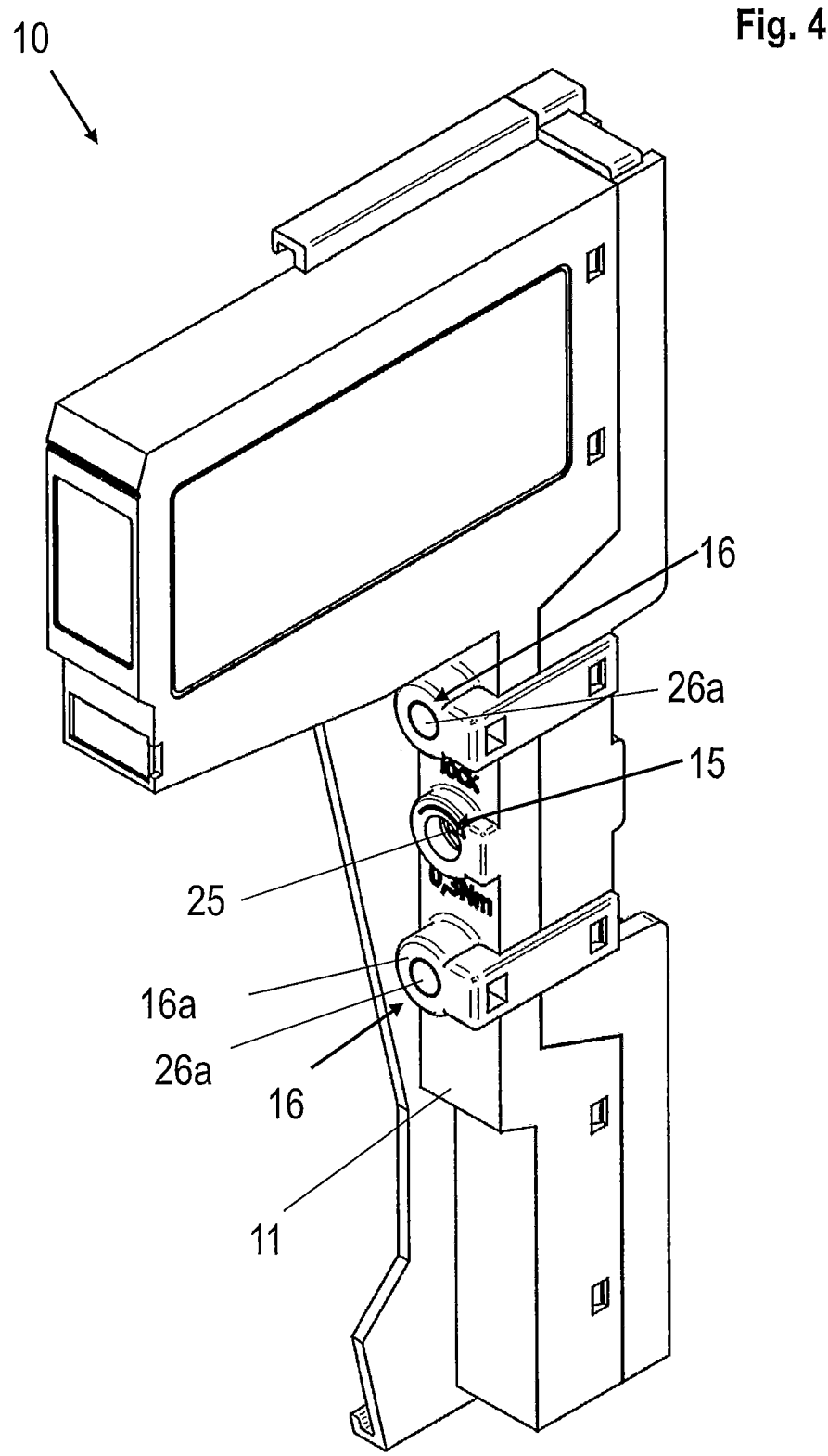
FIG. 4 shows an exemplary clamping module.

FIG. 1 shows the components of an exemplary bracing device 20 of an exemplary clamping module 10 according to the disclosed embodiments (shown in FIGS. 2-4). The bracing device 20 has a pressure-exerting metal panel 21, which is formed by a pressure-exerting plate 21a with two side flanges 21b formed thereon. The pressure-exerting plate 21a of the pressure-exerting metal panel 21 is designed such that, during the installation of the clamping module, it rests at least to some extent on a support rail. A guide groove 21c is formed in at least one of the side flanges 21b.

A pulling element, which in the case of the exemplary embodiment is referred to as a pulling bridge 22, is designed such that it can be arranged within the pressure-exerting metal panel 21. This pulling bridge 22 has at least one guide nose 22a which, in a state in which the pulling bridge 22 is installed within the pressure-exerting metal panel 21, is guided in the guide groove 21c such that the pulling bridge 22 can move toward and away from the pressure-exerting plate 21a, in a direction perpendicular to the same, between the side flanges 21b. On each side of the pulling bridge 22, a retaining claw 24 can be arranged in a pivotable manner in each case on two oppositely arranged protrusions 22b. The protrusions 22b are formed on the pulling bridge 22 in each case in the region of an aperture.

In the exemplary embodiment, the retaining claws 24 are designed in the form of a bent sheet-metal part, and, therefore, one side of the retaining claw 24 has formed on it two opposite retaining lugs 24a with retaining bores 24b, which are arranged in a manner corresponding to the protrusions 22b of the pulling bridge 22, in order for the retaining claw 24 to be mounted in each case in a pivotable manner on the pulling bridge 22. Two claw elements 24c are formed at the other end of a retaining claw 24, the claw elements being provided in order to connect the clamping module 10 to a support rail. In order to establish a form-fitting connection to the support rail, the exemplary embodiment has retaining protrusions 24d formed on each of the claw elements 24c.

Oriented centrally in the pulling bridge 22, and parallel to the guide nose 22a, is a continuous threaded tightening bore 22c, in which an internal thread is formed. This threaded tightening bore 22c is designed to accommodate a tightening screw 25, which can be moved axially in the threaded tightening bore 22c by virtue of being rotated.

In addition to the elements mentioned, the bracing device 20 has two signal elements in the form of signal pins 26, which can be arranged in the housing 11 of the clamping module 10, in the region of the retaining claws 24, and, prestressed by means of spring elements 26c and securing washers 26b, are retained there for movement on a movement path.

FIG. 2 shows a partly cut-away view of an exemplary clamping module 10 according to the disclosed embodiments, having a bracing device 20 made up of the components illustrated in FIG. 1, prior to being positioned on a support rail 35. The exemplary support rail 35 is a top-hat rail, that is to say a U-shaped rail with, in addition, two retaining flanges 35a each arranged perpendicularly in the outward direction on the respective flanges of the U. The exemplary support rail 35 of the exemplary embodiment is a top-hat rail in accordance with EN 50022.

It can be seen in FIG. 2 that the pulling bridge 22 is arranged within the pressure-exerting metal panel 21. In the case of the position illustrated, the tightening screw 25 is seated within the threaded tightening bore 22c such that the end of the tightening screw 25 does not project out of the pulling bridge 22 at the pressure-exerting metal panel 21.

The signal pins 26 are arranged in an axially movable manner between the retaining lugs 24a of the retaining claws 24, by means of spring elements 26c and securing washers 26b, between in each case two protrusions 11a and 11b in the housing 11 of the clamping module 10. The spring element 26c here causes the respective signal pin 26 to be prestressed in each case in the direction of the envisaged installation site on the support rail 35 and/or toward the claw elements 24c of the retaining claws 24. In the case of this exemplary embodiment, the movement path of the signal pins 26 corresponds to the longitudinal axis of the signal pins 26.

The outer side of the housing 11 of the clamping module 10 contains an opening 15, through which the tightening screw 25 is accessible and can be moved in a rotatable manner, and thus in the axial direction, by means of a rotating tool, for example a screwdriver.

It is also the case that two domes 16 are formed on the outer side of the housing 11 of the clamping module 10, and the domes make it possible to ascertain in each case the position of the head 26a of the signal pin 26 from outside the housing 11 of the clamping module 10. FIG. 2 shows the clamping module 11 prior to being positioned on a support rail 35, and, therefore, in a released position. In this situation, the signal pins 26 are in a prestressed position, in which they project through a respective pressure-exerting opening 21d arranged in the pressure-exerting plate 21a of the pressure-exerting metal panel 21. In this position of the signal pins 26, the heads 26a of the signal pins 26 are offset inward from the upper periphery 16a of the domes 16 on the movement path within the domes.

If the clamping module 10 is then pushed flush onto the support rail 35, or the retaining flanges 35a thereof, the lower ends of the signal pins 26 are positioned on the support rail 35, as a result of which the signal pins 26 push upward along their longitudinal axis, that is to say along their movement path, counter to the force of the spring element 26c. If the two heads 26a of the signal pins 26 are flush with the upper periphery 16a of the domes 16, then this signals that the clamping module 10 rests correctly on the support rail 35. If only one head 26a is flush with the upper periphery 16a of its dome 16, this shows that the clamping module 10 is arranged incorrectly in the installation position on the support rail 35.

If the clamping module 10 is arranged on the support rail 35 such that both heads 26a of the signal pins 26 are arranged flush with the upper periphery 16a of the two domes 16, it is possible for the user, while constantly maintaining the position of the clamping module 10, to rotate the tightening screw 25 in the tightening direction of rotation in order to move the pulling bridge 22 away from the support rail 35, as seen in relation to the pressure-exerting metal panel 22, by virtue of the tightening screw 25 being braced on the pressure-exerting plate 21a. The pulling bridge 22 here, guided by the guide nose 22a in the guide groove 21a in the pressure-exerting metal panel 21, shifts upward, in a manner corresponding to the pitch of the tightening screw 25, over the course of the tightening direction of rotation, since the tightening screw 25 is fixed in position by the pressure-exerting metal panel 21 and the housing. In this way, the retaining lugs 24a of the retaining claws 24 are likewise moved away from the support rail 35.

By means of a respective holding-down mechanism 11c, likewise arranged in the housing 11 of the clamping module 10, the retaining claws 24, with retaining protrusions 24d formed thereon, are mounted on the housing 11 such that, during the movement described above of the pulling bridge 22 away from the pressure-exerting metal panel 21, the retaining protrusions are forced to pivot beneath the retaining flanges 35a of the support rail 35. This causes the bracing device 20, or the clamping module 10, to be braced on the support rail 35.

FIG. 3 shows a partly cut-away view of the exemplary clamping module according to the disclosed embodiments from FIG. 2, but this time in a state in which it is secured to the support rail. It can clearly be seen in this figure that the heads 26a of the signal pins 26 are positioned flush with the respectively upper periphery 16a of the domes 16 on the housing 11, while the signal pins 26 rest on the retaining flanges 35a of the support rail 35. It can likewise clearly be seen that the pulling bridge 22 has been braced in an upwardly offset state in relation to the pressure-exerting metal panel 21 by means of the tightening screw 25, as a result of which the retaining claws 24 have been pivoted into the bracing position, in which the clamping module is fixed to the support rail 35.

The operation of removing the clamping module 10 takes place in a manner analogous to the installation operation, by virtue of the steps described being performed in the reverse order. In this case, a rotating tool releases the pulling bridge 22 in relation to the pressure-exerting metal panel 21 by rotating the tightening screw 25 in the release direction, as a result of which the retaining claws 24 are pivoted out of the bracing position.

FIG. 4 shows an exemplary clamping module 10. This view illustrates, in particular, the opening 15, through which the tightening screw 25 is accessible. It is also possible to see two domes 16, in relation to which the signal pins 26 are arranged in a movable manner. On the basis of the position of the respective head 26a of a signal pin 26 in relation to the upper periphery 16a of the respective dome 16, it is possible to ascertain whether the clamping module 10 is arranged on the support rail 35 in a manner suitable for installation purposes.

LIST OF REFERENCE SIGNS

10 Clamping module
11 Housing
20 Bracing device
21 Pressure-exerting metal panel
21a Pressure-exerting plate
21b Side flange
21c Guide groove
21d Pressure-exerting opening
22 Pulling bridge
22a Guide nose
22b Protrusion
22c Threaded tightening bore
24 Retaining claw
24a Retaining lug
24b Retaining bore
24c Claw element
24d Retaining protrusion
25 Tightening screw
26 Signal pin
26a Head of the signal pin
26b Securing washer
26c Spring element
35 Support rail
35a Retaining flange

The invention claimed is:

1. A clamping module for securing to a support rail, the clamping module comprising:
   a housing,
   a bracing device;
   at least one retaining claw arranged on the bracing device, wherein the at least one retaining claw is movable into a securing position on the support rail for bracing there by means of the bracing device to secure the clamping module in a releasable manner to the support rail; and
   a signal device with at least one signal element arranged in the housing and movable along a predetermined movement path as a result of the clamping module being positioned on the support rail, wherein the position of the signal element on the movement path enables the ability to ascertain, from outside the housing, whether the clamping module is arranged correctly on the support rail.

2. The clamping module of claim 1, wherein the signal device includes two signal elements which enable the ability to ascertain a correct arrangement of the clamping module from outside the housing at two different positions.

3. The clamping module of claim 1, wherein the at least one signal element is a signal pin one end of the pin projecting into a region of a surface of the housing when the clamping module is arranged correctly on the support rail.

4. The clamping module of claim 1, wherein the bracing device includes a pulling element, on which the at least one retaining claw is pivotably arranged.

5. The clamping module of claim 4, wherein the bracing device includes a pressure-exerting plate, which butts against the support rail when the clamping module is arranged correctly on the support rail.

6. The clamping module of claim 5, wherein, to secure the clamping module to the support rail, the pulling element is bracable against the pressure-exerting plate, whereby, at least one retaining claw is braced on the support rail.

7. The clamping module of claim 6, wherein the pulling element is braced against the pressure-exerting plate by a tensioning element.

8. The clamping module of claim 1, wherein the support rail is a top-hat rail.

9. The clamping module of claim 1, wherein the housing contains electronic components.

10. A module system comprising:
    a plurality of electronic modules arranged beside one another on a support rail; and a clamping module for securing to the support rail, wherein the clamping module includes a housing, a bracing device, at least one retaining claw arranged on the bracing device, wherein the at least one retaining claw is movable into a securing position on the support rail for bracing there by the bracing device to secure the clamping module in a releasable manner to the support rail, and a signal device with at least one signal element arranged in the housing and movable along a predetermined movement path as a result of the clamping module being positioned on the support rail, wherein the position of the signal element on the movement path enables the ability to ascertain, from outside the housing, whether the clamping module is arranged correctly on the support rail, wherein the clamping module is arranged on at least one side of the electronic modules arranged beside one another.

11. The clamping module of claim 7, wherein the tensioning element is a tightening screw.

12. The system of claim 10, wherein the signal device includes two signal elements which enable the ability to ascertain a correct arrangement of the clamping module from outside the housing at two different positions.

13. The system of claim 10, wherein the at least one signal element is a signal pin one end of the pin projecting into a region of a surface of the housing when the clamping module is arranged correctly on the support rail.

14. The system of claim 10, wherein the bracing device includes a pulling element, on which the at least one retaining claw is pivotably arranged.

15. The system of claim 14, wherein the bracing device includes a pressure-exerting plate, which butts against the support rail when the clamping module is arranged correctly on the support rail.

16. The system of claim 15, wherein, to secure the clamping module to the support rail, the pulling element is bracable against the pressure-exerting plate, whereby, at least one retaining claw is braced on the support rail.

17. The system of claim 16, wherein the pulling element is braced against the pressure-exerting plate by a tensioning element.

18. The system of claim 10, wherein the support rail is a top-hat rail.

19. The system of claim 10, wherein the housing contains electronic components.

20. The system of claim 17, wherein the tensioning element is a tightening screw.

* * * * *